United States Patent [19]

Runyon et al.

[11] Patent Number: 5,046,610

[45] Date of Patent: Sep. 10, 1991

[54] ELECTRONIC COMPONENT CARRIER

[75] Inventors: John F. Runyon, St. Paul; Ted T. Christianson, Bloomington, both of Minn.

[73] Assignee: Christianson Systems, Inc., Blomkest, Minn.

[21] Appl. No.: 607,604

[22] Filed: Oct. 31, 1990

Related U.S. Application Data

[63] Continuation of Ser. No. 471,828, Jan. 29, 1990, abandoned.

[51] Int. Cl.$^5$ ............................................ B65D 73/02
[52] U.S. Cl. .................................................. 206/330
[58] Field of Search ................. 206/328, 329, 330, 332

[56] References Cited

U.S. PATENT DOCUMENTS

| | | |
|---|---|---|
| 3,315,637 | 4/1967 | Taylor . |
| 3,444,993 | 5/1969 | Lunsford ............................ 206/332 |
| 3,523,608 | 8/1970 | Miller ................................. 206/332 |
| 3,921,788 | 11/1975 | Roberson, Jr. et al. . |
| 4,178,113 | 12/1979 | Beaver, II et al. . |
| 4,200,191 | 4/1980 | Nakamura et al. ................. 206/328 |
| 4,619,573 | 10/1986 | Rathman et al. . |
| 4,740,136 | 4/1988 | Asai et al. . |
| 4,849,857 | 7/1989 | Butt et al. ........................... 206/330 |
| 4,852,737 | 8/1989 | Noll .................................... 206/330 |

OTHER PUBLICATIONS

Four-page document from Yamaichi, (Exhibit D).
Four Photographs showing a Mitsubishi product for handling electronic component, (Exhibit E).
Plastronics Inc. catalog entitled, "Burn-In Product, Descriptions and Specifications", 8 pgs., dated 1988 (Exhibit A).
Plastronics Inc. catalog entitled, "Burn-In QEP Carriers/Socket", 4 pgs. dated 1988 (Exhibit B).
Two-page document entitled, "Embossed Carrier Dimensions", (Exhibit C).

Primary Examiner—William I. Price
Attorney, Agent, or Firm—Merchant, gould, Smith, Edell, Welter & Schmidt

[57] ABSTRACT

A carrier having a carrier body to handle and protect electronic surface mount components which have a body portion and extending leads. The carrier body having a bottom member with a flat upper surface portion with a smaller component supporting surface. The bottom member also having locator ribs which surround the component supporting surface. The carrier body also having a restraint structure which extends over at least a part of the component supporting surface. The body portion of the component restrained during handling within the area defined by the component supporting surface, the locator ribs, and the restraint structure.

19 Claims, 3 Drawing Sheets

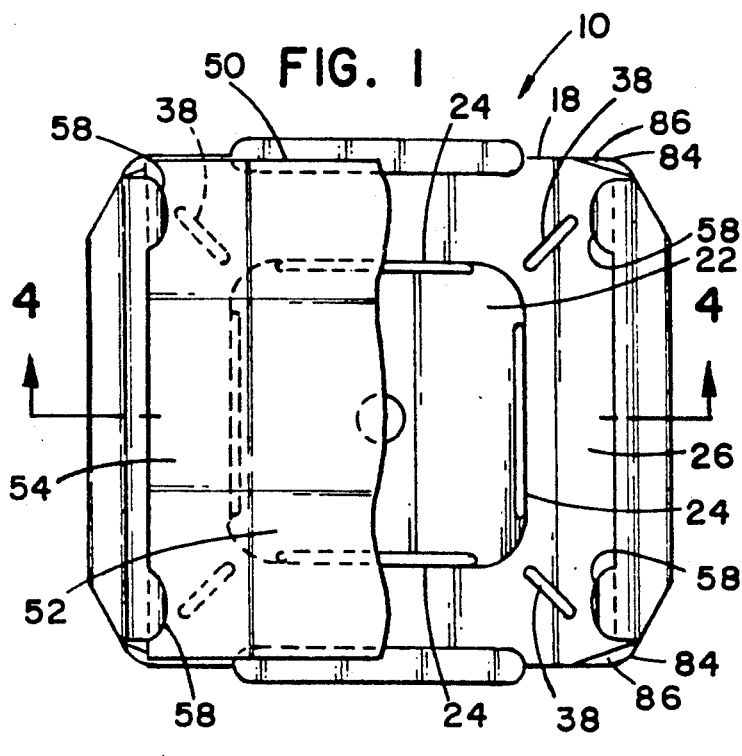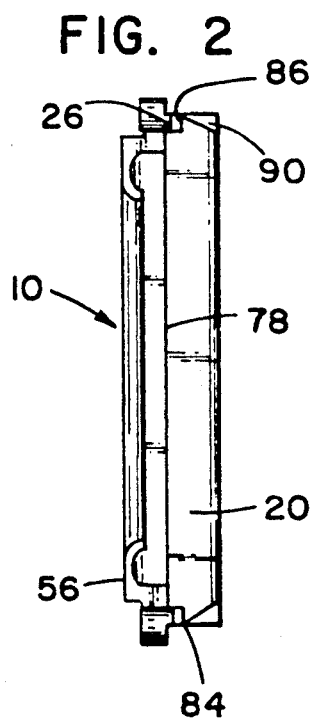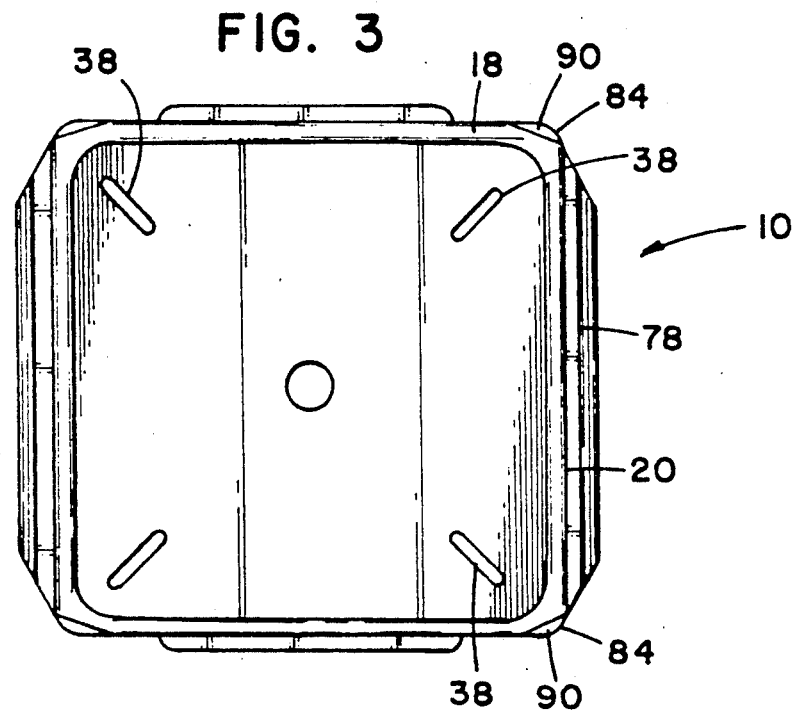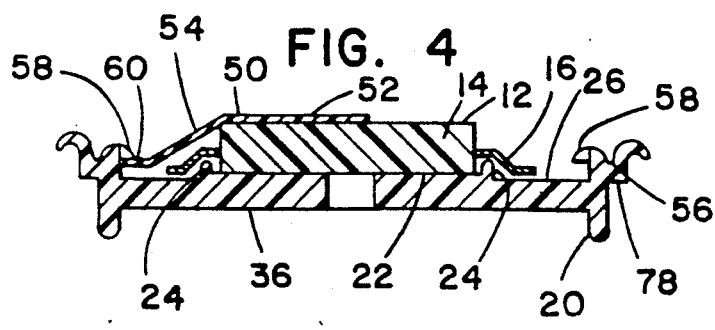

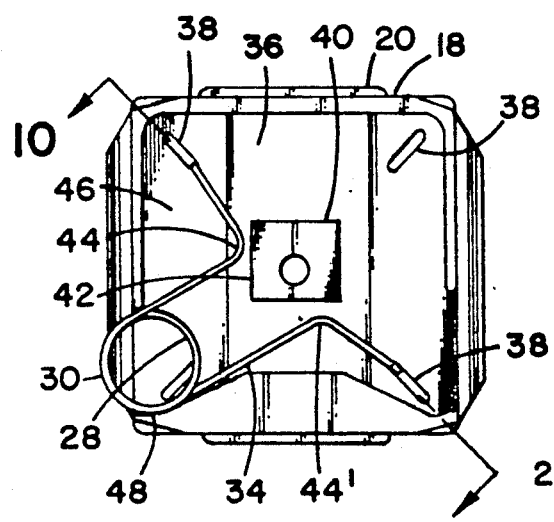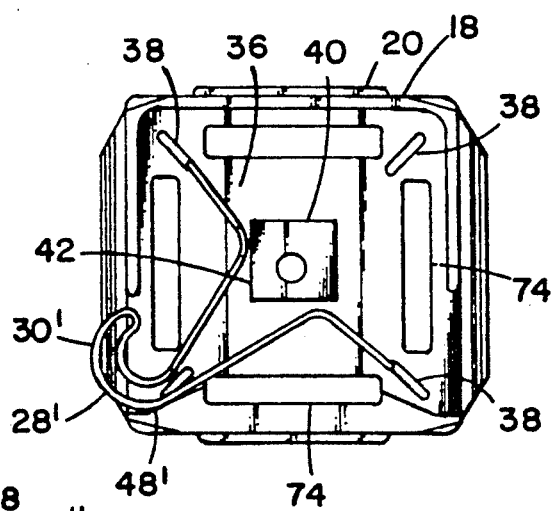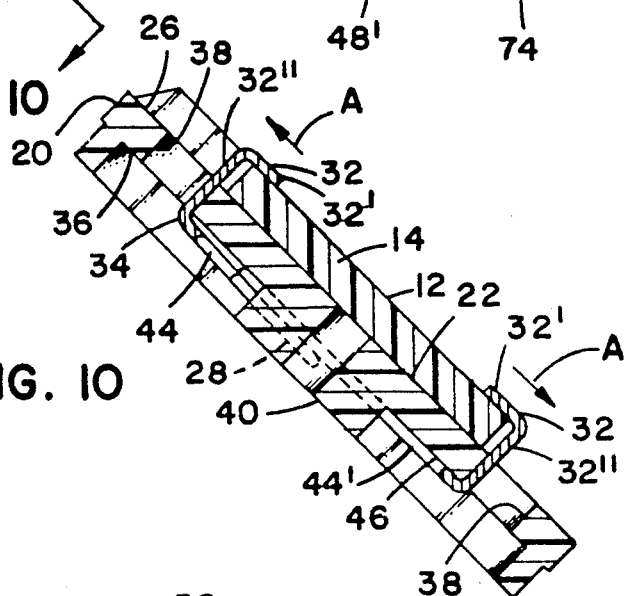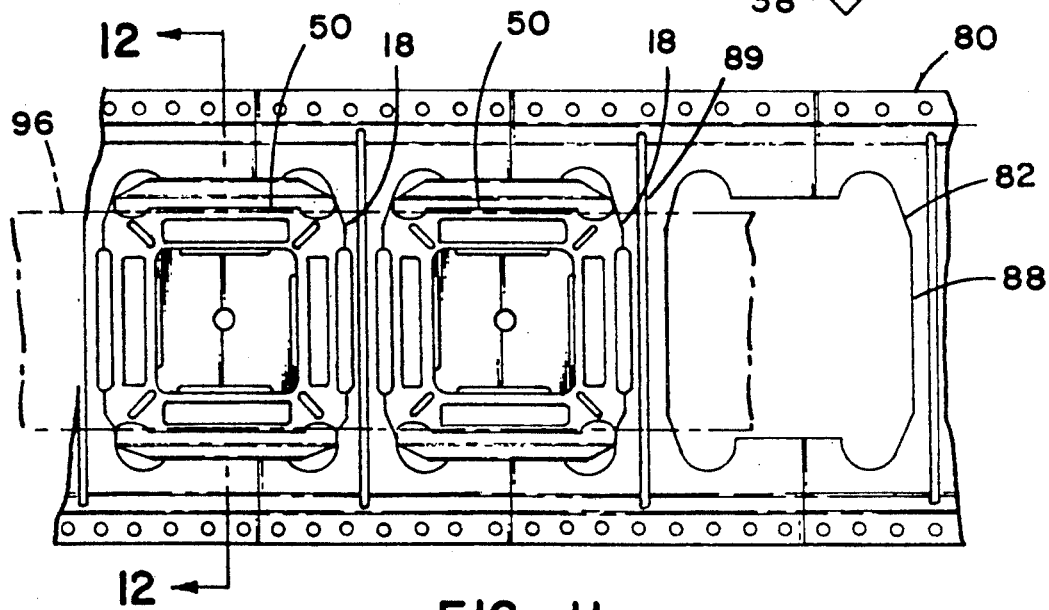

ELECTRONIC COMPONENT CARRIER

This is a continuation of application Ser. No. 471,828, filed Jan. 29, 1990, now abandoned.

TECHNICAL FIELD

This invention relates generally to the field of carriers for carrying objects, and particularly to carriers for carrying electronic components.

BACKGROUND OF THE INVENTION

Many electronic components have a body with metal leads extending from the body. These leads are often numerous, quite small, and very fragile. Within the body of the component, there may also be fragile parts. As a result, the components can be easily damaged during handling from the time of manufacture of the component until the time of installation of the component into a circuit. Damage to the component can occur in several ways. The leads can be damaged through contact with a contaminating substance. They can be damaged through corrosion of the lead material. They can also be damaged if the leads become bent. The component can be ruined if it is not protected from electrical energy exceeding the design limits that commonly exists during handling. Since electronic components can be expensive, damage prevention during handling is often a major concern in the electronics industry.

Prior methods of handling electronic components include inserting the components into tubes. The components are slid into a tube which completely surrounds the component. Handling of the components is accomplished by handling the tubes. Before installing the component into the circuit, the components must be slid back out from the tube. Another method is to attach the components to a flexible tape and then handling the tape. Before installing the component, the component must be detached from the tape. A third method is to place each component on a tray and then handling the tray. Because this method often relies on gravity to keep the component in the tray, care must be taken to prevent the component from being knocked out during handling of the tray. Sometimes these trays have features for mounting the component to the tray. However, these features are often not easily employed and may come in contact with the leads. Not only do all these methods expose the component and its leads to excessive damage during handling, they also do not allow for easy handling of the components individually or in bulk.

The present invention allows the component to be easily handled from the point of manufacture of the component to the point of installation of the component into the circuit while at the same time protecting the component and its fragile leads from damage. During the handling process of the component, the component can be easily placed into, maintained within, and removed from the carrier without exposing the component to excessive damage. The carrier itself can be easily handled either individually or in bulk. These and other advantages of the present invention over the prior art will become more apparent after reading the description and claims which follow.

SUMMARY OF THE INVENTION

This invention is a carrier for use in handling and protecting electronic surface mount components which have a body portion and extending leads. The bottom of the carrier has a flat upper surface with a smaller component supporting surface for supporting the component. Surrounding the component supporting surface are locator ribs. The carrier has a restraining structure which extends over at least part of the component supporting surface. During handling, the body portion of the component is restrained within the area defined by the component supporting surface, the locator ribs, and the restraining structure.

BRIEF DESCRIPTION OF THE DRAWINGS

FIG. 1 is a top view of a first preferred embodiment of the carrier showing the cover partially cut away.

FIG. 2 is a side view of the carrier shown in FIG. 1 without the cover.

FIG. 3 is a bottom view of the carrier shown in FIG. 1 without the cover.

FIG. 4 is a cross-sectional side view of the carrier shown in FIG. 1 showing a component in the carrier.

FIG. 8 is a bottom view of a fourth preferred embodiment of the carrier showing the spring latch in the component restrained position.

FIG. 9 is a bottom view of a fifth preferred embodiment of the carrier showing a modified spring latch in the component restrained position.

FIG. 10 is a cross-sectional side view of the carrier shown in FIG. 8 showing the spring latch in the component retrained position with a component in the carrier.

FIG. 11 is a top view of a carrier sheet and two carriers shown with a continuous tape made of individual covers joined together.

DETAILED DESCRIPTION OF THE DRAWINGS

Figure 5:
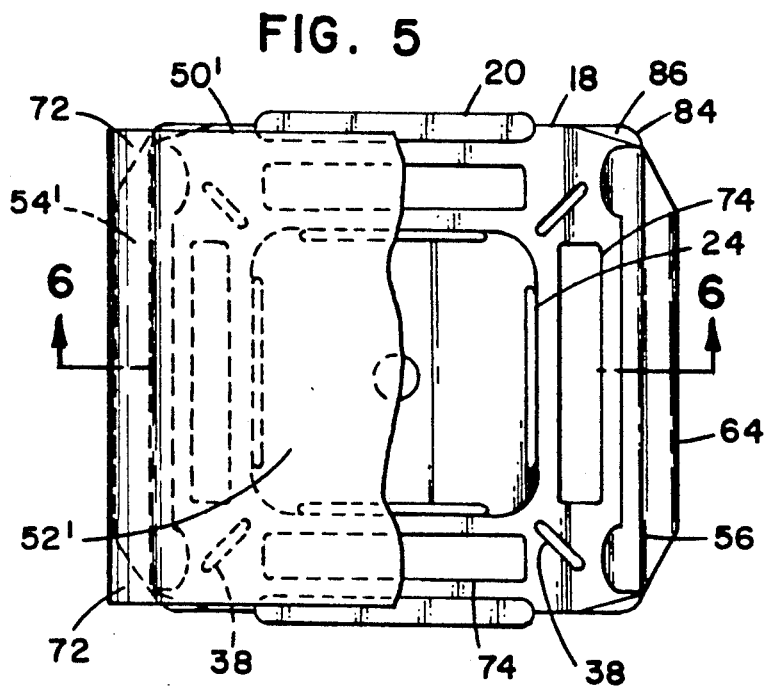
FIG. 5 is a top view of a second preferred embodiment of the carrier showing the cover partially cut away.

Throughout the following description, reference will be made to the drawings and the same numerals will be used throughout several views to indicate the same or like parts of the invention.

Referring now to FIGS. 1-4 showing a first preferred embodiment, the carrier 10 has a carrier body 18 which has a bottom member 20 with a flat upper surface portion 26. The flat upper surface portion has a smaller component supporting surface 22. A plurality of locator ribs 24 surround the component supporting surface. These ribs extend upward from the bottom member. FIG. 1 shows a first preferred embodiment of the carrier body having a cover 50 which extends over the component supporting surface. As best shown in FIGS. 2 and 4, the carrier body 18 has side members 56 which extend upward from the upper surface portion of the bottom member and further surround the upper surface portion 26. The side members have cover tabs 58 extending parallel to and toward the component supporting surface. The cover tabs each have a lower cover tab surface portion 60 facing downward. The cover has a cover edge portion 54. The cover edge portion engages the lower cover tab surface portions of the cover tabs which are located on side members positioned on opposite sides of the bottom member to restrain the cover from upward movement.

FIG. 2 and FIG. 3 show the side and the bottom of the carrier body without the cover. The bottom member 20 and the side members 56 of the carrier body are rigid structures and can be made of conductive, high temperature plastic.

The cover 50 is made of a resilient material and can be made from die cut plastic or thin aluminum. The resilient properties of the cover shown in FIG. 1 biases the cover edge portion 54 outward so that the cover edge portion remains below the lower cover tab surface portion 60. The cover center portion 52 of the cover is higher than the cover edge portion, as shown in FIG. 4. Opposing forces applied to the cover edge portion acting parallel to the component supporting surface will cause the cover center portion to bow upwards away from the component supporting surface. Because the cover center portion bows upward as the forces are applied, the cover edge portion moves inward allowing the cover to be mounted to the carrier side members by lowering the cover while the forces are being applied. After the forces are removed, the cover edge portion is biased back to its original outward location with a portion below the lower cover tab surface portions 60 of the cover tabs 58. To remove the cover, forces are applied to move the cover edge portion inward again and then the cover is lifted upward.

FIG. 4 shows the carrier body with an electronic surface mount component 12 having a body portion 14 restrained in an area defined by the component supporting surface 22, the locator ribs 24, and the cover center portion 52. In this position, the component body portion and the fragile extending leads 16 are protected from damage during handling. Furthermore, during mounting and dismounting of the cover 50, the cover never contacts the leads of the component. The locator ribs are positioned on the carrier body bottom member to locate a specific component body portion. The carrier body shown in FIGS. 1-4 is designed to a hold a Plastic Quad Flat Pack electronic component (not shown). Improper positioning of the locator ribs, such as positioning the ribs too close together, can result in the component not fitting properly into the carrier body. Further, the component will not be sufficiently restrained from horizontal movement during handling if the ribs are too far apart.

FIGS. 1 and 4 show the carrier with a single cover. In bulk handling situations where several carriers have fixed positions adjacent to each other in a line, several covers may be joined together in a single continuous cover tape. FIG. 11 shows multiple carriers fixed in a line. FIG. 11 also shows multiple covers 50 joined together in a continuous cover tape 96 shown by dashed lines. The cover tape would have the same cross-sectional area throughout as the single cover shown in FIG. 4. The cover tape can be mounted to and removed from multiple carriers arranged in a line either simultaneously or successively by the application of opposing forces acting parallel to the component supporting surfaces of the carriers.

Figure 6:
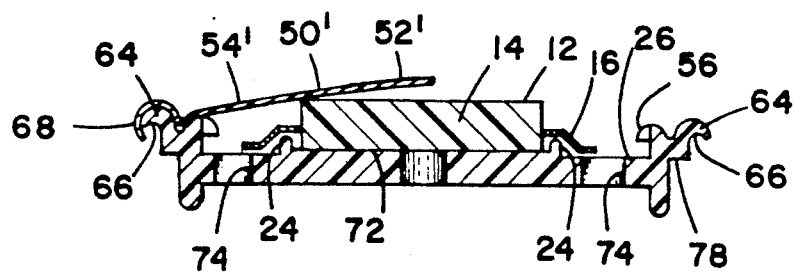
FIG. 6 is a cross-sectional side view of the carrier shown in FIG. 5 showing a component in the carrier.

FIGS. 5 and 6 show a second preferred embodiment of the invention. The carrier body side members 56 on opposite sides of the bottom member each have a gripper rail 64. The gripper rails each have a lower rail surface portion 66 extending outward from the side members 56. The gripper cover 50' has a curled portion 68 along the gripper cover edge portion 54'. The curled portion surrounds the gripper rails and engages the lower rail surface portions of the gripper rails to restrain the cover from upward movement. As shown in FIGS. 1-6, the carrier body side members can simultaneously have gripper rails 64 and cover tabs 58 to allow for the different covers to be used interchangeably with the carrier body.

The gripper cover 50' is designed with a rigid but resilient material. The cover center portion 52' biases the gripper cover edge portion 54' upward when the gripper cover edge portion is bent downwards. By bending the sides of the gripper cover 50' not having the curled portions upward, the curled portions 68 on each side of the gripper cover 50' will open to snap over the gripper rails 64 to mount the gripper cover to the carrier body 18. When the curled portion snaps over the gripper rail, the cover center portion resists the bending moments produced as the gripper cover edge portion is held down by the curled portion 68 engaging the lower rail surface portion 66 of the gripper rail 64. This helps maintain contact between the gripper cover edge portion and the gripper rails to restrain the gripper cover from upward movement. To remove cover 50', the curled portion spreads outward as the gripper cover is bent upward along the sides not having the curled portions. Because the curled portions spread open as the gripper cover is bent upward along the sides not having the curled portions, the gripper cover engages and disengages from the gripper rails without having to awkwardly pry the curled portions outward away from the gripper rails.

FIGS. 5 and 6 show a carrier with a single gripper cover 50'. In bulk handling situations where several carriers have fixed positions adjacent to each other in a line, several gripper covers may be joined together in a single continuous cover tape. FIG. 11 shows multiple carriers fixed in a line. While FIG. 11 shows multiple covers 50 joined together in a continuous cover tape 96, multiple gripper covers 50' would be joined together in a similar tape having gripper cover edge portions 54' instead of cover edge portions 54. The cover tape would have the same cross-sectional area throughout as the single gripper cover shown in FIG. 6. To mount the gripper covers of the cover tape to each carrier, each gripper cover is snapped simultaneously or successively over the gripper rails of each carrier in the series. Similarly, to remove the gripper covers from the carriers, the cover tape would be bent simultaneously or successively upward from each carrier in the series.

The gripper cover 50' also has a gripping portion 72 extending beyond the gripper rail 64 as shown in FIG. 5. The gripping portion provides a gripping surface for easy removal of the gripper cover from the gripper rails by peeling away the gripper cover.

FIG. 6 shows the carrier body with gripper cover 50' restraining the component body portion 14 in an area defined by the component supporting surface 22, the locator ribs 24, and the gripper cover center portion 52'. In this position the component body and the extending leads 16 are protected from damage during handling. Furthermore, during mounting and dismounting of the gripper cover 50', the gripper cover never contacts the leads of the component.

Figure 7:
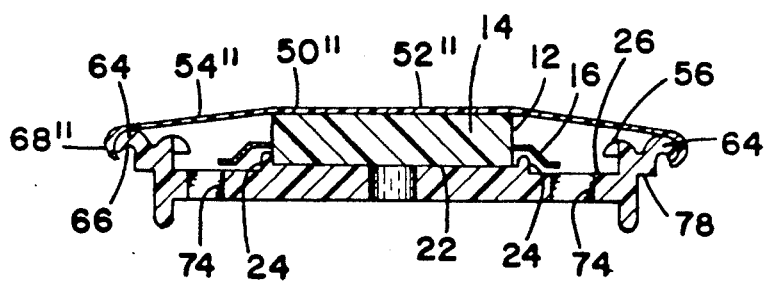
FIG. 7 is a cross-sectional side view of a third preferred embodiment of the carrier showing a component in the carrier.

FIG. 7 shows a third preferred embodiment of the invention. The modified gripper cover 50" has a modified gripper cover center portion 52" which is maintained in tension. As shown in FIG. 7, portions of the component body portion extend above a plane defined by the tops of the gripper rails 64. The modified gripper cover center portion is made of a thin flexible material which resiliently stretches across the component top surface in contact with it. Tension is developed to restrain the component in the carrier body. The modified curled portion 68" grips the lower rail surface portions 66 of each gripper rail 64 to maintain tension, restraining the modified gripper cover from upward movement. The component body portion 14 is restrained in the area defined by the component supporting surface 22, the locator rails 24, and the modified gripper cover center portion 52". In this position, the component body and the extending leads 16 are protected from damage during handling. Furthermore, during mounting and dismounting of the modified gripper cover 50", the modified gripper cover never contacts the leads of the component.

Like covers 50 and gripper covers 50', the modified gripper covers 50" can also be joined together in a continuous cover tape as shown in FIG. 11 for the covers 50. This cover tape would also be mountable either successively or simultaneously to the carriers fixed in a line during bulk handling.

As shown in FIGS. 4, 6, and 7, the cover 50, the gripper cover 50', and the modified gripper cover 50" are designed so that the center portions contact the component body portion 14 as the component rests on the component supporting surface 22 while the component is restrained. This contact produces a downward force acting to restrain the component from any upward movement. Creep may occur in the cover material because of storage time or temperature, reducing the hold down force of the cover on the component to zero. However, the covers remain in contact with the component body and mounted to the carrier body side members 56 so that as soon as the component body pushes up against the covers, the covers will resist with downward force on the component body. Because the carrier body restrains the covers from upward movement, it is not necessary that the covers even be designed to initially maintain a hold down force on the component. They must merely be designed to not allow the component body portion to leave the area between the component supporting surface 22, the locator ribs 24, and the cover center portion 52, the gripper cover center portion 52', or the modified gripper cover center portion 52" depending upon which embodiment is employed.

A fourth preferred embodiment of the invention is shown in FIGS. 8 and 10. The carrier body has a spring latch 30 which has L-shaped latch tips 32 as is best shown in FIG. 10. The latch tips have top portions 32' extending generally parallel to and over a portion of the component supporting surface 2 and side portions 32" extending generally perpendicular to and outside of the component supporting surface. The latch tips are moveable between two positions, one where the top portions extend over the component supporting surface, called the component restrained position, and a second where they are pulled away from and parallel to the component supporting surface, called the component unrestrained position. The direction of movement of the latch tips from position one to position two is shown by arrow A in FIG. 10. The latch tips are connected by a latch actuator 34. The latch actuator has a spring portion 28 that resiliently biases the latch tips to the first position, or component restrained position. The spring portion shown in FIG. 8 is a torsion coil spring. A portion of the spring portion extends beyond the perimeter of the bottom member when the spring latch is in the component restrained position as shown in FIG. 8. The latch actuator also has V-shaped actuator arms 44 and 44' parallel to the component supporting surface and connecting the latch tips to the ends of the spring portion. Movement of these actuator arms causes movement of the latch tips. The spring latch can be bent from a one-piece, low-cost wire, making the spring latch easy and inexpensive to manufacture.

The bottom member 20 of the carrier body has an actuator cavity 36 which lies below the upper surface portion 26 as seen in FIG. 10. Spring latch guide slots 38 extend upward from the actuator cavity to the upper surface portion. These guide slots are located near opposite corners of the upper surface portion 26 outside the locator ribs 24 and inside the side members 56. The location of these guide slots on the upper surface portion 26 are best shown in FIG. 1, although FIG. 1 illustrates the first preferred embodiment employing a cover 50 as the component restraining structure. The slots are positioned so that when the latch tips are in the component restrained position, the top portions 32' of the latch tips extend over at least a portion of the component supporting surface 22. When the latch tips move toward the component unrestrained position, the guide slots allow the top portions 32' of the latch tips to be pushed away from the component supporting surface. The guide slots are elongate shaped and are sufficiently wide to allow the latch tips to slide easily between the component restrained and unrestrained positions. The guide slots also function as a guide to help guide the spring latch during movement of the latch tips. The spring latch tips 32 are inserted upward through these guide slots. The latch actuator 34 remains below in the actuator cavity 36. The string latch is restrained from upward movement by the actuator arms 44 and 44' engaging the upper surface 46 of the actuator cavity FIG. 10 shows a cross-sectional view of the latch tips 32 restraining a component body portion 14 within the area defined by the component supporting surface 22, the locator ribs 24 (not shown), and the top portions 32' of the latch tips 32. The latch tips can be designed to engage the component body portion while the body portion rests on the component supporting surface. However, the spring latch will restrain the component adequately if the latch tips are slightly higher but not so high as to permit the component body portion to rise higher than the ribs, thus leaving the area defined by the component supporting surface, the locator ribs, and the latch tips. To release the component from the restraint area, the latch tips are forced apart by moving the latch arms apart. When the tips are in the component unrestrained position, the component body portion 14 is no longer restrained from upward movement by the latch tips and the component can be lifted from the carrier.

The actuator cavity 36 has a latch actuating ramp 40 which extends downward from the actuator cavity upper surface 46. The carrier body can be designed so that the latch actuating ramp is an integral part of the carrier body or it can be a separate piece which snaps into the actuator cavity upper surface. The latch actuating ramp has a ramp surface 42 which slidably engages the actuator arm 44 to guide the spring latch as it moves the tips toward and away from the component supporting surface. Latch arm 44' does not engage the latch actuating ramp and merely functions as a link between the spring portion and the latch tip. When the actuator arm 44 is pushed against the ramp surface by an external force applied to the latch actuator, the latch tips move apart. The spring latch, the latch actuating ramp and the guide slots together produce equal spread of the latch tips despite input to the latch actuator that is not symmetrical. Additional guide surfaces 48 can also be provided to help guide the spring latch and produce equal latch tip spread as the actuator arm is forced against the latch actuating ramp.

Figure 12:
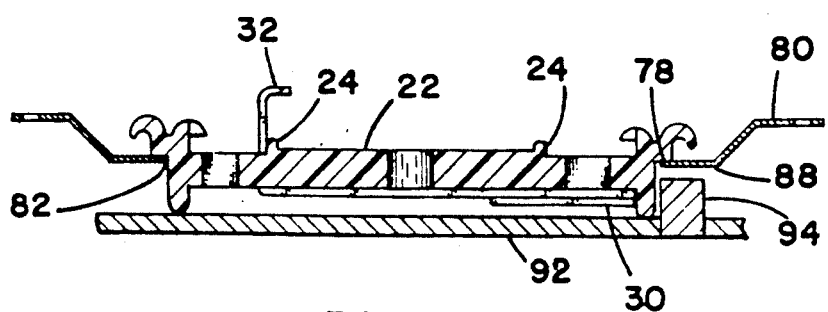
FIG. 12 is a cross-sectional side view of the carrier sheet and the carriers shown in FIG. 11 without the covers but having a spring latch and showing a latching plate below the carrier with a perpendicular latching post.

The latch actuating ramp 40 can be employed to move the latch tips 32 away from the component supporting surface 22 by simply moving the carrier past a latching post 94 as shown in FIG. 12 which has a surface for slidably engaging the spring latch to force the latch are 44 against the ramp surface 42 to cause movement of the latch tips 32 from the component restrained position to the component unrestrained position. The latching plate 92 serves as a mount for the perpendicular latching post. As shown in FIG. 8, the spring portion 28 extends slightly beyond the perimeter of the carrier bottom member 20. The latching post is slid along the side of the carrier body 18 to engage the part of the spring portion protruding beyond the bottom member causing actuation of the spring latch and movement of the latch tips. Actuation can also occur by moving the carrier while the latching post is fixed. The carrier sheet shown in FIG. 11, for example, may be transported past a stationary post which deflects the spring latch of each carrier as they pass the post to cause each spring latch to successively move the latch tips of each carrier to the component restrained position. When the carriers are bulk handled, simultaneous actuation to release many components can be accomplished with multiple posts attached one per carrier to a latching plate located beneath the carriers. The plate may have the deflection posts in a single row or arranged in a grid pattern depending upon how the carriers are bulk handed.

As shown in FIGS. 5, 6, and 9, test access slots 74 are provided to allow the component to be electrically tested without removing the component from the carrier body. This feature helps reduce the likelihood of damage to the component because the component can be placed in a carrier at the point of its manufacture and can remain there until the time to place the component into a circuit. FIG. 9 shows a fifth preferred embodiment having a modified spring latch 30' that is used when the carrier body has the test access slots. The modified string latch has a modified spring portion 28' formed to avoid interference with the test access slots yet still bias the latch tips to the component restrained position. The test access slots permit a test probe to be inserted into the carrier from below. If the test probe enters from above the component, an insulated backing bar can instead be inserted up through the slots to support the leads during testing.

The fourth and fifth embodiments shown in FIGS. 8-10 only show one spring latch 30 and 30'. In some circumstances it may be useful to provide a second spring latch to restrain the component. A second spring latch can be added after the first one is in place by inserting the latch tips of the second spring latch up through the other two guide slots not being used. The spring portion of the second spring latch would lie in a mirror image location on the opposite side of the bottom member and would similarly extend slightly past the bottom member.

FIG. 11 shows the carrier body employed for bulk handling in a single row carrier sheet 80. The carrier sheets are made of thin material and have mounting openings 82 cut out in the shape of the perimeter of the bottom member of the carrier. The openings have additional rounded corner cut outs to reduce problems caused by sharp internal corners of openings cut exactly to the shape of the perimeter of the carrier bottom member. Bulk handling carrier sheets can have openings cut in single rows as in FIG. 11 or in cut grid patterns (not shown). The carrier sheets are sufficiently rigid to maintain a generally flat shape. Alternatively, the carrier sheets can be made flexible enough to allow the sheet to be wound around a spool during bulk handling of the carriers. In that case, the mounting openings can be cut with sufficient spacing to avoid buckling of the carrier sheet between the carriers as the sheet is wound around the spool or the carrier sheet can have slits 89 shown in FIG. 11 cut between the mounting openings in the sheet to avoid buckling of the carrier sheet.

FIG. 12 is a cross-sectional side view of the carrier body 18 and the carrier sheet 80 shown in FIG. 11. As discussed earlier, FIG. 12 also illustrates the position of the latching plate 92 and the latching post 94 which are only employed with the spring latch to cause actuation of the spring latch. The carrier sheet 80 has a trough-shaped cross-sectional area as shown in FIG. 12. The trough is sufficiently deep such that when the carrier body has a component 14 (not shown in FIG. 12) restrained in the body, a plane formed by the top of the carrier sheet would not contact the spring latch or the cover.

As shown in FIGS. 4, 6, 7, and 12, the bottom member 20 of the carrier body 18 includes a stop seat 78 extending parallel to and away from the bottom member and extending beyond the perimeter of the opening in the carrier sheet. The stop seat supports the carrier on the carrier sheet during handling by engaging the carrier sheet edge 88 as the bottom member is lowered into the opening in the carrier sheet.

The bottom member 20 also includes a plurality of body tabs 84 as shown in FIGS. 1, 2, 3 and 5. The body tabs have a generally flat upper body tab surface portion 86 lying in a plane parallel to and below the stop seat 78 as shown in FIG. 2. The upper body tab surface also extends beyond the perimeter of the mounting opening 82 in the carrier sheet and is engagable with the carrier sheet edge 88 so as to restrain the carrier body from upward movement away from the carrier sheet after the carrier body is inserted into the mounting opening 82. The interaction of the body tabs 84 and the stop seat 78 locks the carrier body to the carrier sheet during handling. As shown in FIGS. 1 and 3, the upper body tab surface is not directly below the stop seat, allowing the carrier body to be manufactured without difficult to manufacture mold undercuts. The body tab also includes an inclined side surface portion 90 as shown in FIG. 3. The inclined side surface portion extends downward and toward the bottom member. The inclined side surface portion deflects the carrier sheet outward away from the bottom member as the carrier is lowered into the mounting opening until the carrier sheet edge flexes back to lie between the upper body tab surface of the body tab and the stop seat.

As described above, the component body potion can be restrained in the carrier body in the area defined by the component supporting surface, the locator ribs, and either the cover center portion of the cover or the latch tips of the spring latch. However, it may also be desirable in some instances to employ both a cover and a spring latch to restrain and protect the component during handling. The preferred embodiments 1 through 5 only illustrate either a cover or a spring latch. If both a spring latch and a cover are simultaneously employed, neither will interfere with the other during handling of the component if the covers are modified slightly to include holes or blisters to avoid interference with the latch tips.

In some circumstances, it may also be desirable to employ a carrier body with a cover that only restricts the component in the area in the carrier body formed by the bottom member, the side members and the cover, eliminating the need for the locator ribs. In that case, the component would bounce around in the carrier body but not leave the carrier body. This would only be the case, however, if the component could withstand that type of handling without damage.

The invention is not to be construed as limited to the specific embodiment shown in the drawings but is to be limited only by the broad general meanings of the following claims.

We claim:

1. A carrier for use in handling and protecting electronic surface mounted components which have a body portion and extending leads comprising:
a carrier body having a bottom member with a flat upper surface portion defining a smaller component supporting surface, said bottom member having a plurality of locator ribs surrounding said component supporting surface, said carrier body further having restraining means mountable thereon so as to extend over at least a portion of said component supporting surface to hold a selected component body portion within a chamber defined by said ribs, said supporting surface and said restraining means, with the leads thereof extending over said ribs, said restraining means including a spring latch having two latch tips and a resilient latch actuator connecting said latch tips, said spring latch movable between a component restrained position where said latch tips extend over at least a portion of said component supporting surface and a component unrestrained position where said latch tips are positioned away from said component supporting surface, said latch actuator resiliently biasing said latch tips from said component unrestrained position to said component restrained position, said carrier body further having spring latch mounting means for mounting said spring latch to said carrier body.

2. The carrier of claim 1 wherein said spring latch mounting means includes a plurality of spring latch guide slots through said bottom member, said latch tips extending upward though said guide slots, and said spring latch including engaging means for engaging said bottom member to restrain upward movement thereof.

3. The carrier of claim 2, wherein said latch actuator includes a spring portion, and a pair of actuator arms extending from said spring portion parallel to said upper surface portion, said bottom member further including an actuator cavity below said upper surface portion with an upper actuator cavity surface, and said engaging means including said actuator arms engaging said upper actuator cavity surface so as to restrain said spring latch from upward movement thereof.

4. The carrier of claim 3, wherein said actuator cavity includes a latch actuating ramp extending downward having a ramp surface, said ramp surface slidably engaging at least one of said actuator arms as said spring latch moves said latch tips between said component restrained position and said component unrestrained position.

5. The carrier of claim 1, wherein said restraining means includes a cover made of resilient material having a cover center portion extending over at least a portion of said component supporting surface, said cover further including a cover edge portion, said carrier body further having a plurality of side members extending upward from said bottom member, said side members surrounding said upper surface portion, said side members including mounting means for mounting said cover edge portion to said side members.

6. The carrier of claim 5, wherein said mounting means includes cover tabs attached to said side members each having a lower cover tab surface portion extending above at least a portion of said cover edge portion so as to restrain said cover from upward movement thereof.

7. The carrier of claim 5, wherein said mounting means includes a gripper rail attached to said side members having a lower rail surface portion extending outward away from said side members, said cover edge portion having a curled portion surrounding said gripper rail and engagable with said lower rail surface portion so as to restrain said cover tape from upward movement thereof.

8. The carrier of claim 7, wherein said cover edge portion extends beyond said gripper rail exposing a gripping portion of said cover so as to provide a gripping surface to peel away said cover from said gripper rail.

9. The carrier of claim 7, wherein said cover center portion resiliently stretches across said component supporting surface and said curled portion resiliently grips said gripper rail to restrain said cover from upward movement thereof.

10. The carrier of claim 7, wherein said cover center portion resiliently biases said cover edge portion upward and said curled portion resiliently snaps around said gripper rail to restrain said cover from upward movement thereof.

11. The carrier of claim 1, wherein said bottom member includes a plurality of test access slots extending through said bottom member, said test access slots surrounding said component supporting surface outside of said locator ribs.

12. The carrier of claim 1, wherein said bottom member includes a stop seat extending away from said bottom member, and a carrier sheet having a mounting opening therein sized to accommodate said carrier, said stop seat being engagable with an edge of said carrier sheet mounting opening so as to support said carrier on said carrier sheet during handling of said carrier.

13. The carrier of claim 12, wherein said bottom member includes a body tab having an upper body tab surface portion located below said stop seat, said upper body tab surface portion engagable with said edge of said carrier sheet so as to restrain said carrier from upward movement away from said carrier sheet during handling of said carrier.

14. The carrier of claim 13, wherein said body tab includes an inclined side surface portion extending downward and away from said upper body tab surface toward said bottom member, said inclined side surface portion slidably engaging said carrier sheet edge as said carrier is mounted in said mounting opening so as to deflect said carrier sheet edge outward until said carrier sheet edge flexes back between said upper body tab surface portion and said stop seat.

15. The carrier of claim 2, further comprising actuating means for moving said spring latch between said component restrained position and said component unrestrained position.

16. The carrier of claim 15 wherein said actuating means includes a latching post perpendicular to said bottom member, said latching post movable relative to said carrier body, said latching post engagable with said latch actuator during relative movement of said latching post and said carrier body, said latching post forcibly moving said spring latch to move said latch tips between said component restrained position and said component unrestrained position as said latching post is moved relative to said carrier.

17. The carrier of claim 16 wherein a plurality of said latching posts simultaneously engage latch actuators of a plurality of said carriers.

18. The carrier of claim 12, wherein said carrier sheet includes a plurality of mounting openings therein, said mounting openings positioned linearly in said carrier sheet, and said carrier sheet further including an elongated slit between each of said mounting openings perpendicular to the line formed by said mounting openings, said slits being longer than said mounting openings, whereby said carrier sheet portions adjacent to said slits bend as said carrier sheet is formed to a circular shape.

19. A spring latch apparatus for use in restraining a component from movement away from a carrier body, the carrier body having a bottom member with an upper component supporting surface and a lower surface facing in an opposite direction to the upper component supporting surface, said spring latch apparatus comprising:

a spring portion including a pair of actuator arms;

a pair of latch tips, each of said latch tips extending from said actuator arms of said spring portion;

said latch tips being movable between a component restrained position wherein a portion of said latch tips extend over at least a portion of the upper component supporting surface, and a component unrestrained position wherein said latch tips are positioned away from the upper component supporting surface, said spring portion resiliently biasing said latch tips toward said component restrained position;

said spring portion being located adjacent the lower surface of the bottom member and said latch tips extending from the lower surface toward the upper component supporting surface through transverse slots provided in the bottom member, said spring portion being engageable with the lower surface of the bottom member to limit transverse movement of latch tips away from the upper component supporting surface; and said latch tips cooperating with the upper component surface of the bottom member to restrain the component in a chamber defined by the upper component supporting surface of the bottom member of the carrier body and said latch tips when said latch tips are in said component restrained position, said latch tips releasing the component from said chamber when said latch tips are in said component unrestrained position.

* * * * *

UNITED STATES PATENT AND TRADEMARK OFFICE
CERTIFICATE OF CORRECTION

PATENT NO. : 5,046,610

DATED : Sept. 10, 1991

INVENTOR(S) : John F. Runyon, Ted T. Christianson

It is certified that error appears in the above-identified patent and that said Letters Patent is hereby corrected as shown below:

In Column 3, line 49, please delete "a" after the word "to".

In Column 4, line 32, please insert --the gripper-- after the word "remove".

Column 4, line 64, the word "grippe:" should read --gripper--.

In Column 5, line 62, "2" should read --22--.

In Column 6, line 46, please insert --.- after the word "cavity".

In Column 7, line 23, "are" should read --arm--.

In Column 7, line 45, "handed" should read --handled--.

In Column 7, line 56, "string" should read --spring--.

In Column 9, line 3, "potion" should read --portion--.

Signed and Sealed this

Ninth Day of March, 1993

Attest:

STEPHEN G. KUNIN

Attesting Officer     Acting Commissioner of Patents and Trademarks